United States Patent [19]

Nishimura et al.

[11] Patent Number: 4,995,696
[45] Date of Patent: Feb. 26, 1991

[54] OPTICAL AMPLIFIER MODULE

[75] Inventors: Eiichi Nishimura; Yasuaki Tamura, both of Tokyo, Japan

[73] Assignee: Oki Electric Industry Co., Ltd., Tokyo, Japan

[21] Appl. No.: 494,852

[22] Filed: Mar. 15, 1990

Related U.S. Application Data

[63] Continuation of Ser. No. 354,442, May 17, 1989, abandoned.

[30] Foreign Application Priority Data

May 20, 1988 [JP] Japan .................... 63-121806

[51] Int. Cl.5 ............................ G02B 6/36; G02F 1/00
[52] U.S. Cl. ............................... 350/96.2; 350/96.18; 350/96.21; 350/416; 455/601; 455/602; 455/610; 455/612
[58] Field of Search ............... 350/96.15, 96.16, 96.17, 350/96.18, 96.20, 311, 96.21, 416; 250/227.11; 455/601, 602, 603, 610, 612; 372/6, 43; 357/17, 19

[56] References Cited

U.S. PATENT DOCUMENTS

| | | | |
|---|---|---|---|
| 4,104,533 | 8/1978 | Iverson | 455/602 |
| 4,440,470 | 4/1984 | Khoe | 350/96.2 |
| 4,640,585 | 2/1987 | Nojiri | 350/96.18 X |
| 4,705,351 | 11/1987 | Toda | 350/96.18 |
| 4,708,426 | 11/1987 | Khoe | 350/96.18 |
| 4,767,171 | 8/1988 | Keil et al. | 350/96.18 |
| 4,768,070 | 8/1988 | Takizawa et al. | 357/17 |
| 4,778,241 | 10/1988 | Haltenorth | 350/96.2 |
| 4,830,453 | 5/1989 | Khoe | 350/96.18 |
| 4,834,491 | 5/1989 | Aoki et al. | 350/96.2 |
| 4,842,391 | 6/1989 | Kim et al. | 350/96.18 |

Primary Examiner—Brian Healy
Attorney, Agent, or Firm—Spencer & Frank

[57] ABSTRACT

A fiber input/output type semiconductor optical amplifier module is disclosed. The optical amplifier module of the present invention, a semiconductor laser amplifier chip is provided for direct amplification of signal light beam. An optical coupling between the semiconductor laser chip and an input/output fibers is taken with a remote coupling using a parallel light beam. Collimator lenses are provided for converting the lightwave signal into a parallel light beam. Two optical isolators are provided for preventing a self-lasing of the semiconductor laser chip. One of the isolators is inserted on an input side of the semiconductor laser chip, and the other is inserted on an output side of the chip. An interference filter and a beam splitter are disposed in the output side of the semiconductor laser chip. The beam splitter splits the output signal of the semiconductor laser chip for monitoring an output power of the chip.

24 Claims, 5 Drawing Sheets

OPTICAL AMPLIFIER MODULE

This application is a continuation of application Ser. No. 070/354,442, filed May 17, 1989 now abandoned.

BACKGROUND OF THE INVENTION

1. Field of the Invention:

The present invention relates to an optical amplifier for use in a long-haul lightwave communication system, and more specifically to an optical amplifier module capable of direct amplification of a signal light with the use of a semiconductor laser.

2. Description of the Prior Art:

Recent rapid progress in the telecommunication field requires more and more improved transmission technology capable, for example of transmitting a big volume of information to further remote sites. To satisfy such requirements a fiber optic transmission system has been proposed hitherto. An optical fiber, a low loss medium enjoys long-distance transmission. To extend the transmission distance, the fiber optic transmission sYstem includes an optical repeater inserted into an optical fiber transmission line. For such an optical repeater, a system is known until now which converts an optical signal to an electrical one and after some electrical processings renders the resulting electric signal an electro-optic conversion to reproduce an optical signal. Additionally, recent development in this field find another example of such an optical repeater capable of directly amplifying an optical signal without conversion of the signal to an electric one. The latter optical repeater has an advantage in being miniaturized and simplified, compared with the former optical repeater to effect the electro-optic conversion. Such an optical amplifier may include a semiconductor laser, for example. An example of an optical fiber with a semiconductor laser is disclosed in "Low Loss Coupling between Semiconductor Lasers and Single-mode Fiber Using Tapered Lensed Fibers" British Telecom. Technol J. Vol. 4, No. 2, Apr. 1986. FIG. 1 illustrates the configuration, where a semiconductor laser amplifier chip 21 is directly coupled with tapered fibers 22. FIG. 2 illustrates the configuration of the optical amplifier of FIG. 1 being disposed in a fiber optical transmission system. Such a configuration is disclosed in "400 Mbit/s, 372 km Coherent Transmission Experiment Using In-Line Optical Amplifiers", Electronics Letters Vol. 24, No. 1, Jan. 1988. That is, the optical amplifier device in a practical application is comprised of an optical amplifier 31, an isolator 32, a filter 33, a coupling 34, and an output power monitor 35, all members connected in series, and further connected with an optical fiber 36 and an optical coupler 37.

However, the conventional optical amplifier devices of the type described above suffer from the following difficulties: The conventional optical amplifier coupled with the semiconductor laser as illustrated in FIG. 1 is unstable in optical coupling between the optical fibers and the semiconductor laser because the optical coupling is done directly. The optical amplifier device of the type as illustrated in FIG. 2 has drawbacks because the alignment among constituent optical members is difficult.

SUMMARY OF THE INVENTION

In view of the drawbacks of the prior art, it is an object of the present invention to provide an optical amplifier module providing stable optical coupling.

Another object of the present invention is to provide an optical amplifier module comprised of a reduced number of parts.

Still another object of the present invention is to provide an optical amplifier module capable of adjusting optical coupling with ease.

To achieve the above objects, an optical amplifier module according to the present invention comprises, in one aspect, a package, an input fiber, an output fiber, and a semiconductor laser chip for amplifying an input optical signal, first collimator means disposed on the input side of the semiconductor laser chip for collimating the input optical signal to couple the input fiber with the semiconductor laser chip, second collimator means disposed on the output side of the semiconductor laser chip for collimating an output amplified optical signal to couple the semiconductor laser chip with the output fiber, first isolator means disposed on the input side of the semiconductor laser chip and second isolator means disposed on the output side of the semiconductor laser chip.

An optical amplifier module according to the present invention comprises, in the other aspect, a package, an input fiber, an output fiber, a semiconductor laser chip for amplifying an input optical signal, first collimator means disposed between the input optical fiber and the semiconductor laser chip for collimating the input optical signal into an input parallel light beam and for optically coupling the input optical fiber with the semiconductor laser chip, said means including first and second collimating lenses, second collimator means disposed between the semiconductor laser chip and the output optical fiber for collimating the output optical signal into an output parallel light beam and for optically coupling the semiconductor laser chip with the output optical fiber, said collimator means including third and fourth collimating lenses, first mounting means for mounting said input fiber and said first collimating lens, second mounting means for mounting the semiconductor laser chip and said second and third collimating lenses, and third mounting means for mounting the output fiber and said fourth collimating lens.

The above and other objects, features and advantages of the present invention will become more apparent from the following description when taken in conjunction with the accompanying drawings.

DESCRIPTION OF THE PREFERRED EMBODIMENT

Figure 1:
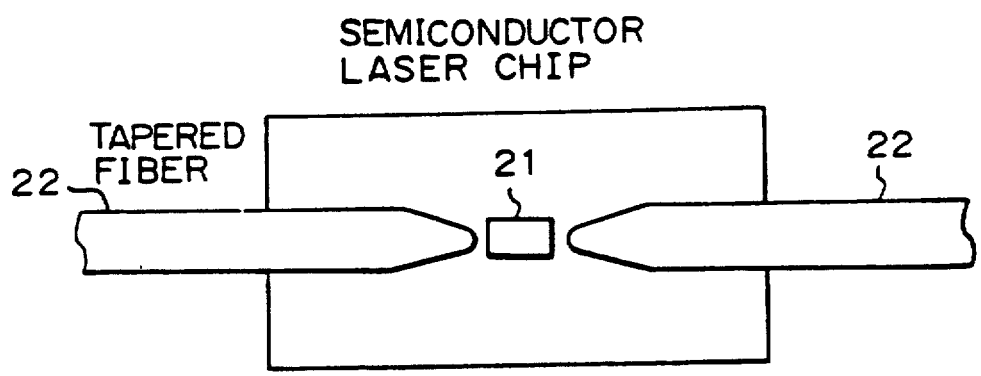
FIG. 1 shows a configuration of an optical amplifier module using a semiconductor laser chip.
Figure 2:
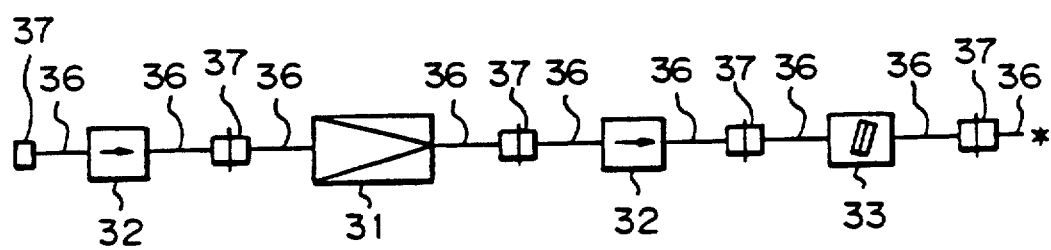
FIG. 2 shows a configuration of an optical amplifier system using the optical amplifier module of FIG. 1.
Figure 2:
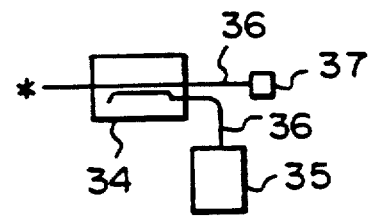
Figure 3:
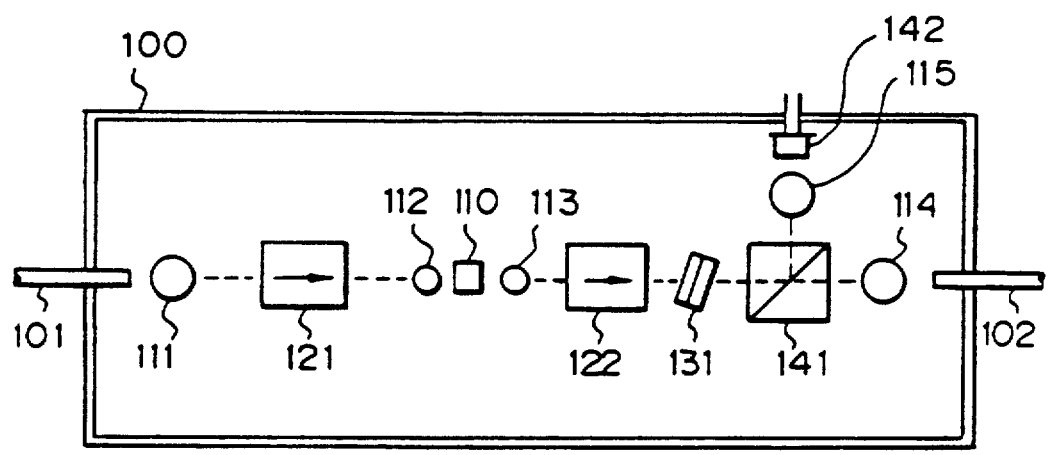
FIG. 3 shows a configuration of an optical amplifier module according to the present invention.

Referring to FIG. 3, an optical amplifier module, an embodiment of the present invention will be described. The optical amplifier module includes a package 100, an input fiber 101, and an output fiber 102. The optical amplifier module is inserted into and connected with an optical transmission path of an optical communication system via the above input and output fibers 101, 102. That is, an input signal light, which is to be amplified, is introduced into the package 100 through the input fiber 101, and an amplified signal light is connected to the optical transmission path of the optical communication system through the output fiber 102.

The input signal light introduced into the optical amplifier module exits from the rear facet of the input optical fiber 101 into a space defined in the package 100, and is incident upon the front facet of the output optical fiber 102. Thereupon, the signal light propagates the space in the package 100 without use of any optical fiber. For this, the optical axis of the signal light is aligned to those of the input and output fibers 101, 102.

A semiconductor laser chip 110 is disposed within the package 100 at a proper location on the optical axis of the signal light. An input coupling space (an input side) lies between the rear facet of the input optical fiber 101 and the semiconductor laser chip 110. Likewise, an output coupling space (an output side) lies between the semiconductor laser chip 110 and the frontal end of the output optical fiber 102.

The package 100 further houses therein five collimating lenses 111, 112, 113, 114, 115. The lenses 111, 112, 113, 114 are disposed on the optical axis of the signal light. The lenses 111 and 112 are disposed in the input side and the remaining lenses 113, 114 are disposed in the output side.

The collimating lens 111 is disposed at a focusing position, on which any incident light is focused therethrough, located at the rear facet of the input optical fiber 101, for the purpose of converting the incident signal light from the rear facet of the input optical fiber 101 to a parallel light beam. The collimating lens 112 is disposed at a focusing position, on which the incident light is focused therethrough, at the front facet of the semiconductor laser chip 110, for the purpose of allowing the parallel light beam formed by the collimating lens 111 to be incident upon the semiconductor laser chip 110. Thus, the parallel light beam formed as such can optically couple the input optical fiber 101 and the semiconductor laser chip 110 through the collimating lenses 111, 112. Also in the output coupling space, a parallel light beam can realize such optical coupling through the collimating lenses 113, 114.

The package 100 further houses two isolators 121, 122, which are disposed on the optical axis of the signal light, particularly the former isolator 121 being positioned in the input coupling space while the latter isolator 122 being positioned in the output coupling space. Isolators 121 and 122 are disposed between collimating lenses 111 and 114 which preferably are ball lenses.

The package 100 also houses an interference filter 131 and a beam splitter 141 arranged in this order between the isolator 122 and the collimating lens 114.

The package further houses the foregoing collimating lens 115 and a photodiode 142 as means to monitor the output signal light from the semiconductor laser chip 110.

Both front and rear facets of the semiconductor laser chip 110 are preferably coated thereover with an antireflection coating. The residual reflectivity of each facet is approximately less than 0.01%.

The optical coupling through the parallel light beam is more advantageous than that in the conventional direct coupling between a laser chip and a tapered fiber, as described below.

Figure 4A:
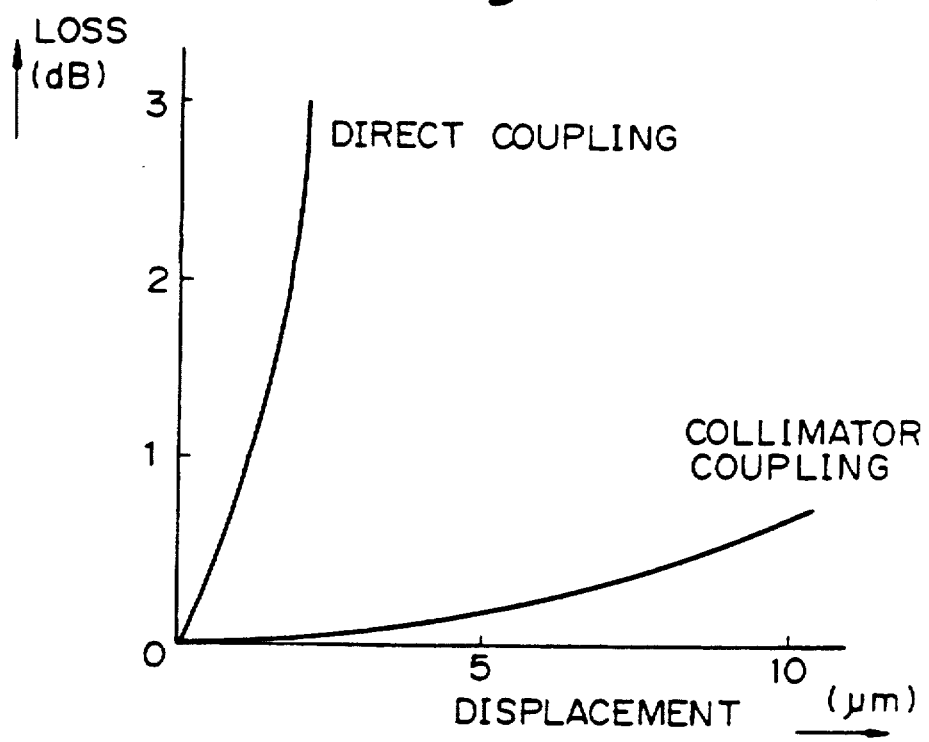
FIGS. 4A and 4B are graphs illustrating relationships between a semiconductor amplifier chip and an optical fiber with respect to relative positional variations and optical coupling loss.
Figure 4B:
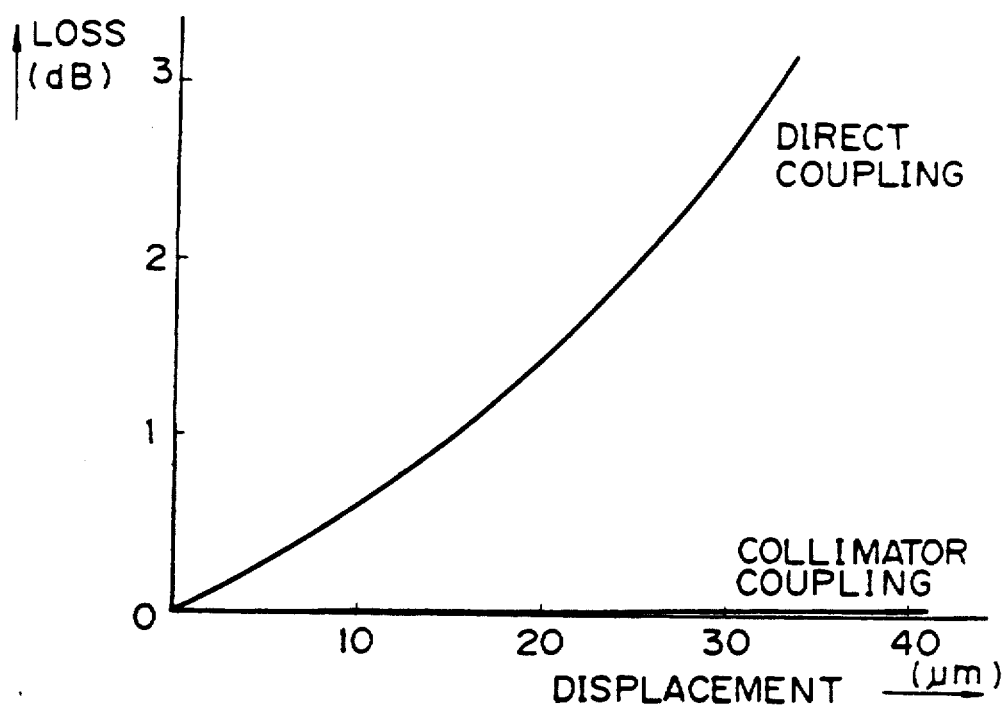

(1) The reduction of optical coupling efficiency between the semiconductor laser chip 110 and the input and output fibers is very slight. Generally, when such an optical amplifier module is practically used, it may suffer from a heat vibration, heat external mechanical force, etc. There is a possibility, owing to such unfavorable factors, of a relative position being varied between the input/output fibers and the semiconductor laser chip. However, the optical coupling utilizing the parallel optical beam in accordance with the present invention minimizes the reduction of the optical coupling in the conventional case caused by such positional variations. In particular, such reduction is little in the direction of the optical axis. Referring here to FIGS. 4A and B variations of optical coupling losses due to positional changes between the constituent members are illustrated in both cases of the direct coupling and the collimator coupling. FIG. 4(A) shows the positional changes in a direction perpendicular to the optical axis, and FIG. 4(B) in a direction of the optical axis.

(2) Hereby, stable output power can be assured.

(3) In case of the direct coupling between the semiconductor chip and the optical fibers, spontaneous emission light emitted from the semiconductor laser chip is reflected back by the facet of the optical fiber and is again incident upon the semiconductor laser chip. This causes self-lasing of the semiconductor laser chip. However, in case of the remote coupling with use of the collimating lens, reentrance of such spontaneous emission light upon the semiconductor laser chip is seldom even if it is reflected back by the surface of the collimating lens. Thus, the collimating coupling can effectively prevent the semiconductor laser chip from self-lasing.

The application of the optical coupling to the optical amplifier module has advantages described below.

(1) Stable output power can be obtained.

(2) Adjustment of optical coupling upon manufacture is more facilitated.

(3) A larger distance can be assured between the semiconductor laser chip and the optical fiber. Hereby, a space therebetween can accommodate various optical parts, for example, an optical isolator can be inserted. Additionally, the semiconductor laser chip can hermetically sealed with ease.

The semiconductor laser chip 110 is mounted on a current/heat converter element, for example on a Peltie element, at need. The bias current and the wavelength of the amplifier, both giving a maximum gain of the same, range around 190 mA and 1.28 $\mu$m, respectively. The input fiber 101 and the output fiber 102 are preferably polarization maintaining fibers. In addition, the rear facet of the input fiber 101 and the front facet of the output fiber 102 are coated with an anti-reflection coating, respectively, together with the collimating lenses 111, 112, 113, 114, 115. The two isolators 121, 122 are to further reduce the self-lasing of the semiconductor laser chip 110. The insertion loss and the isolation loss of each isolator are of 0.8 dB and 30 dB, respectively. Both surfaces of those isolators are preferably coated with an anti-reflection coating, respectively. An interference filter 131 eliminates the spontaneous emission involved in the output light from the semiconductor laser chip 110. The interference filter 131 has the central wavelength of 1.28 μm, and full width half maximum (FWHW) of 15 nm. The efficiency of the coupling between the facets of the semiconductor laser chip and the input/output fibers are of approximately $-4$ dB for stimulated emission. A beam splitter 141 is included in monitor means for monitoring the output power of the semiconductor laser chip 110. The monitor means further includes a collimating (monitor) lens 115 and a photo diode (monitoring optical detector element) 142. The beam splitter 141 has a splitting ratio (R/T) of for example 1/10. The resulting loss through the beam splitter 141 is of about 0.5 dB. The light splitted in part by the beam splitter 141 enters the photo diode 117, where it is converted into an electric signal. The bias current for the semiconductor laser chip 110 is controlled based upon the intensity of the above electric signal. Another set of such monitor means may be provided in front of the isolator 121. Hereby, power levels on both input and output sides of the semiconductor laser chip 110 can be measured. By comparing the outputs of these sets of the monitor means, the output gain of the semiconductor laser chip 110 can be measured.

To ease the adjustment of the optical coupling, it is effective to integrally fix the input fiber 101 and the collimating lens 111, and the output fiber 102 and the collimating lens 114, respectively, together with a set of the semiconductor laser chip 110 and the collimating lenses 112, 113.

Figure 5A:
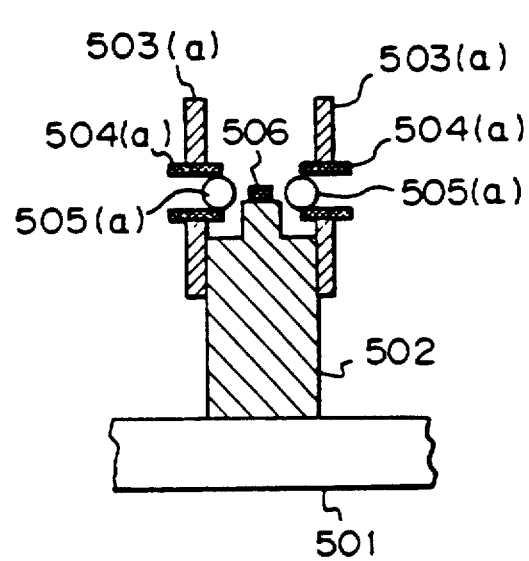
FIGS. 5A and 5B are frontal and side views illustrating a mount for fixedly mounting a semiconductor laser chip and a collimating lens.

Referring to FIGS. 5A and B, a mount for fixedly mounting the semiconductor laser chip and the collimating lenses is illustrated. The mount is provided on a base 501, on which a chip holder 502 is fixedly mounted. On both sides of the chip holder 502 sleeve holders 503(a), 503(b) and lens holders 504(a), 504(b) are held. Inside the lens holders 504(a), 504(b) collimating lenses 505(a), 505(b) are held in a fitting relation. A semiconductor laser chip 506 is retained on the chip holder 502.

Figure 6:
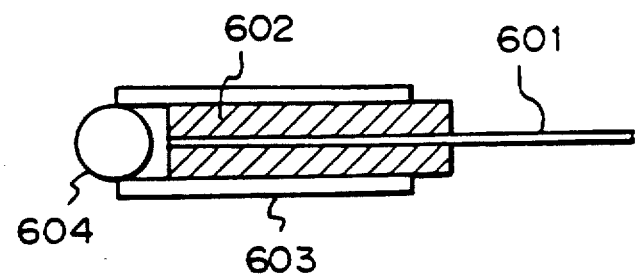
FIG. 6 is a side view in cross section illustrating a mount for fixedly mounting input/output fibers and the collimating lens.

Referring further to FIG. 6, a mount for fixedly mounting thereon the input/output fibers and the collimating lens is illustrated. An optical fiber 601 is retained inside a ferrule 602, which ferrule is fixedly mounted in a sleeve 603 by press fitting. A collimating lens 604 is also retained in the sleeve 603 in a fitting relation. Thus, an optical coupling can be realized between the collimating lens 604 and the optical fiber 601. Such a mounting structure can be applied to the input fiber and the output fiber.

Figure 5B:
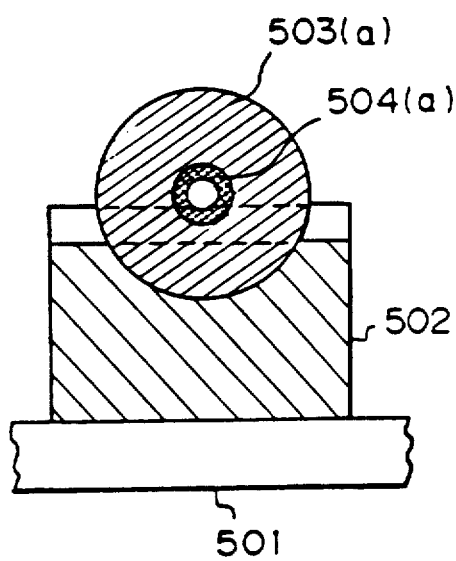

Using the mount illustrated in FIGS. 5A, 5B and 6, an optical coupling between the semiconductor laser chip and the collimating lens or that between the optical fiber 601 and the collimating lens 604 is effected. Thereafter, housing of these mounts in the package may be realized by the adjustment only of the optical coupling between those mounts.

Figure 7:
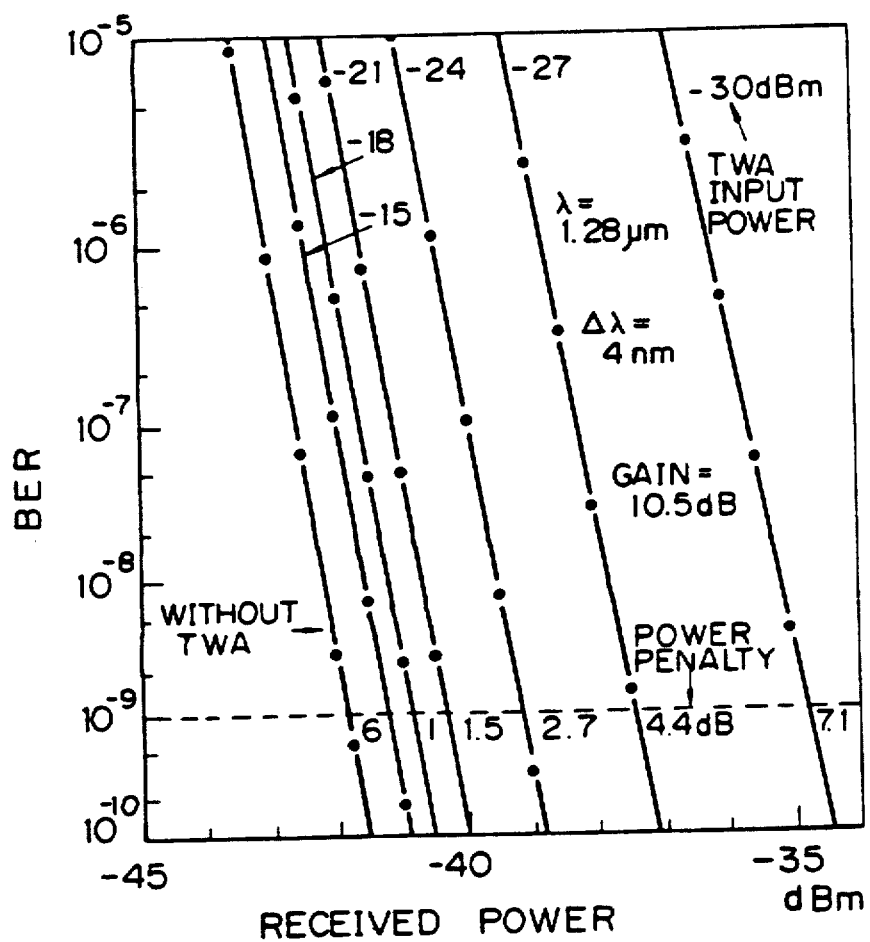
FIG. 7 is a view illustrating BER (Bit Error Rate) characteristic curves.

Referring finally to FIG. 7, bit error rate (BER) characteristic curves are illustrated as a function of the semiconductor laser input power, including those of a case without the optical amplifier module. As illustrated on the figure, the power penalty of the optical amplifier module increases considerably when the input power to the module is less than $-21$ dBm. Such characteristics imply that optical amplifier applications are more suitable for situations in which the optical power of the light transmission through the optical fiber is about $-20$ dBm.

Although a certain preferred embodiment has been shown and described, it should be understood that many changes and modifications may be made therein without departing from the scope of the appended claims.

What is claimed is:

1. An optical amplifier module comprising:
    (a) a package for housing constituent elements;
    (b) an input optical fiber disposed on the input side of the module for guiding an input optical signal into the module;
    (c) an output optical fiber disposed on the output side of the module for taking out an output optical signal to the outside;
    (d) a semiconductor laser chip disposed between the input optical fiber and the output optical fiber for amplifying the input optical signal into the output optical signal;
    (e) first collimator means disposed between the input optical fiber and the semiconductor laser chip for collimating the input optical signal and for optically coupling the input optical fiber with the semiconductor laser chip through an input parallel light beam;
    (f) second collimator means disposed between the semiconductor laser chip and the output optical fiber for collimating the output optical signal and for optically coupling the semiconductor laser chip with the output optical fiber through an output parallel light beam;
    (g) first isolator means disposed on the input side of the semiconductor laser chip; and
    (h) second isolator means disposed on the output side of the semiconductor laser chip.

2. An optical amplifier module according to claim 1, wherein the first and second collimator means are two ball lenses, respectively, and the first and second isolator means are disposed between the two ball lenses.

3. An optical amplifier module according to claim 1, wherein it further comprises filter means disposed on the output side of the semiconductor laser chip for cutting off spontaneous emission from the semiconductor laser chip.

4. An optical amplifier module according to claim 1, wherein it further comprises monitor means disposed on the output side of the semiconductor laser chip for monitoring the output power of the semiconductor laser chip.

5. An optical amplifier module according to claim 1, wherein it further comprises gain monitor means disposed on the input and output sides of the semiconductor laser chip for monitoring the output gain level of the semiconductor laser chip.

6. An optical amplifier module according to claim 4, wherein the power monitor means includes a beam splitter disposed between the output fiber and the semiconductor laser chip for splitting the output light of the semiconductor laser chip, a photodiode for detecting and converting the light so splitted to an electric signal; and a collimating lens disposed between the beam splitter and the photodiode for collimating the light splitted and directing it onto the photodiode.

7. An optical amplifier module according to claim 5, wherein the gain monitor means comprises first measuring means disposed on the input side of the semiconductor laser chip and second measuring means disposed on the output side of the same, the first measuring means including a beam splitter disposed between the input fiber and the semiconductor laser for splitting the input optical signal, a photodiode for detecting and converting the optical signal so splitted to an electric signal for determination of optical input power to the semiconductor laser chip, and a collimating lens disposed between the beam splitter and the photodiode for collimating the light splitted and directing it to the photodiode, the second measuring means including a beam splitter disposed between the output fiber and the semiconductor laser chip for splitting the output light from the semiconductor laser chip, a photodiode for detecting and converting the output light so splitted to an electric signal to determine optical output power of the semiconductor laser chip, and a collimating lens disposed between the beam splitter and the photodiode for collimating the light splitted and directing it to the photo diode, the optical input power and the optical output power specifying the output gain level of the semiconductor laser chip.

8. An optical amplifier module according to claim 3, wherein the second isolator means is located in front of the filter means and the monitor means.

9. An optical amplifier module according to claim 3, wherein the second isolator means is disposed in front of the filter means and the second measuring means.

10. An optical amplifier module comprising:
   (a) a package for housing constituent elements;
   (b) an input optical fiber disposed on the input side of the module for guiding an input optical signal into the module;
   (c) an output optical fiber disposed on the output side of the module for taking out an output optical signal to the outside;
   (d) a semiconductor laser chip disposed between the input optical fiber and the output optical fiber for amplifying the input optical signal into the output optical signal;
   (e) first collimator means disposed between the input optical fiber and the semiconductor laser chip for collimating the input optical signal and for optically coupling the input optical fiber with the semiconductor laser chip through an input parallel light beam, the means including a first collimating lens disposed on the side of the input fiber and a second collimating lens disposed on the side of the semiconductor laser chip;
   (f) second collimator means disposed between the semiconductor laser chip and the output optical fiber for collimating the output optical signal and for optically coupling the semiconductor laser chip with the output optical fiber through an output parallel light beam, the collimator means including a third collimating lens disposed on the side of the semiconductor laser chip and a fourth collimating lens disposed on the side of the semiconductor laser chip;
   (g) first isolator means disposed between the first collimating lens and the second collimating lens;
   (h) second isolator means disposed between the third collimating lens and the fourth collimating lens;
   (i) first mounting means disposed on the input side of the module for mounting the input fiber and the first collimating lens;
   (j) second mounting means disposed on the middle portion of the module for mounting the semiconductor laser chip and the second and third collimating lenses; and
   (k) third mounting means disposed on the output side of the module for mounting the output fiber and the fourth collimating lens.

11. An optical amplifier module according to claim 10, wherein it further comprises filter means inserted between the second isolator means and the fourth collimating lens for cutting off the spontaneous emission of the semiconductor laser chip.

12. An optical amplifier module according to claim 11 wherein it further comprises monitor means inserted between the filter means and the fourth collimating lens for monitoring output optical power of the semiconductor laser chip.

13. An optical amplifier module according to claim 10, wherein it further comprises gain monitor means disposed on the input and output sides of the semiconductor laser chip for monitoring the output gain level of the semiconductor laser chip.

14. An optical amplifier module according to claim 12, wherein the power monitor means includes a beam splitter disposed between the output fiber and the semiconductor laser chip for splitting the output light of the semiconductor laser chip, a photodiode for detecting and converting the light so splitted into an electric signal; and a collimating lens disposed between the beam splitter and said photodiode for collimating the light splitted and directing it onto the photodiode.

15. An optical amplifier module according to claim 13, wherein the gain monitor means comprises first measuring means disposed on the input side of the semiconductor laser chip and second measuring means disposed on the output side of the same, the first measuring means including a beam splitter disposed between the first isolator means and the second collimating lens for splitting the input optical signal, a photodiode for detecting and converting the optical signal so splitted to an electric signal for determination of optical input power to the semiconductor laser chip, and a collimating lens disposed between the beam splitter and the photodiode for collimating the light splitted and directing it to the photodiode, the second measuring means including a beam splitter disposed between the output fiber and the semiconductor laser chip for splitting the output light from the semiconductor laser chip, a photodiode for detecting and converting the output light so splitted into an electric signal to determine optical output power from the semiconductor laser chip, and a collimating lens disposed between the beam splitter and the photodiode for collimating the light splitted and directing it to the photodiode, the optical input power and the optical output power specifying the output gain level of the semiconductor laser chip.

16. An optical amplifier module comprising:
   (a) a package for housing constituent elements;
   (b) an input optical fiber disposed on the input side of the module for guiding an input optical signal into the module;
   (c) an output optical fiber disposed on the output side of the module for guiding an output optical signal out of the module;
   (d) a semiconductor laser chip disposed between the input optical fiber and the output optical fiber for amplifying the input optical signal to produce the output optical signal;
   (e) first collimator means disposed between the input optical fiber and the semiconductor laser chip for collimating the input optical signal and for optically coupling the input optical fiber with the semiconductor laser chip through a parallel light beam, and (f) second collimator means disposed between the semiconductor laser chip and the output optical fiber for collimating the output optical signal and for optically coupling the semiconductor laser chip with the output optical fiber through a parallel light beam.

17. An optical amplifier module according to claim 16, further comprising first isolator means disposed on the input side of the semiconductor laser chip and second isolator means disposed on the output side of the semiconductor laser chip.

18. An optical amplifier module according to claim 17, wherein the first collimator means includes first and second lenses, the second collimator means includes third and fourth lenses, and wherein the first isolator means is disposed between the first lens and the second lens, and the second isolator means is disposed between the third lens and the fourth lens.

19. An optical amplifier module according to claim 18, wherein the first, second, third and fourth lenses are ball lenses.

20. An optical amplifier module according to claim 17, further comprising filter means, disposed on the output side of the semiconductor laser chip, for cutting off spontaneous emission from the semiconductor laser chip.

21. An optical amplifier module according to claim 20, wherein the second isolator means is disposed in front of the filter means.

22. An optical amplifier module according to claim 17, further comprising power monitor means disposed on the output side of the semiconductor laser chip for monitoring an output power of the semiconductor laser chip.

23. An optical amplifier module according to claim 21, wherein the power monitor means includes a beam splitter disposed between the semiconductor laser chip and the output optical fiber for splitting the output parallel light beam, a photodiode for detecting and converting the splitted light beam to an electric signal; and a collimating lens disposed between the beam splitter and the photodiode for collimating the splitted light beam and for directing it onto the photodiode.

24. An optical amplifier module according to claim 17, further comprising means for measuring an output gain level of the semiconductor laser chip, wherein the measuring means including first measuring means disposed on the input side of the semiconductor laser chip for measuring the input signal level and second measuring means for measuring the output signal level, and whereby the input signal level and the output signal level specifying the output gain level of the semiconductor laser chip.

* * * * *